(12) United States Patent
Nozaki et al.

(10) Patent No.: US 7,682,998 B2
(45) Date of Patent: Mar. 23, 2010

(54) CERAMIC POWDER FOR A GREEN SHEET AND MULTILAYER CERAMIC SUBSTRATE

(75) Inventors: Ayumi Nozaki, Tokyo (JP); Akira Yamada, Tokyo (JP); Kiyoshi Saito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 157 days.

(21) Appl. No.: 12/026,219

(22) Filed: Feb. 5, 2008

(65) Prior Publication Data

US 2008/0187730 A1 Aug. 7, 2008

(30) Foreign Application Priority Data

Feb. 6, 2007 (JP) ............................. 2007-026811
Nov. 27, 2007 (JP) ............................. 2007-305662

(51) Int. Cl.
*C03C 14/00* (2006.01)
*B32B 3/00* (2006.01)

(52) U.S. Cl. .................. 501/32; 428/210; 264/618; 264/619

(58) Field of Classification Search .................. 501/15, 501/17, 32; 428/210; 264/618, 619
See application file for complete search history.

(56) References Cited

U.S. PATENT DOCUMENTS 6,448,195 B2 * 9/2002 Kishida et al. ................ 501/32

7,544,629 B2 * 6/2009 Ito et al. ........................ 501/32

FOREIGN PATENT DOCUMENTS

| JP | 8-11696 | 2/1996 |
| JP | 11-292567 | 10/1999 |
| JP | 2000203878 | * 7/2000 |

OTHER PUBLICATIONS

Keita Miyasato and Yoshiharu Suzuki, "Glass Fiber and Glass Fiber Fabrics", Journal of Japan Institute of Electronics Packaging, vol. 4, No. 2, 2001, pp. 98-101 (with English Abstract).

* cited by examiner

*Primary Examiner*—Karl E Group
(74) *Attorney, Agent, or Firm*—Oblon, Spivak, McClelland, Maier & Neustadt, L.L.P.

(57) ABSTRACT

Provided is a ceramic powder for a green sheet that gives a low-temperature fired ceramic substrate that can be fired at a temperature of 900° C. or lower and has excellent dielectric properties in the higher frequency bands such as microwave and millimeter-wave bands, has a low hygroscopicity, and has minor warping and creasing even in the case of co-firing with a silver-based conductor paste, the ceramic powder for a green sheet including a glass powder and an alumina powder, in which the glass powder contains 35 to 39% by weight of $SiO_2$, 9 to 17% by weight of $Al_2O_3$, 21 to 40% by weight of $B_2O_3$, 10 to 20% by weight of R'O, wherein R' is one or more kinds selected from the group consisting of Mg, Ca and Ba, 0.2 to 2% by weight of $Li_2O$, and 0.5 to 2% by weight of $MO_2$, wherein M is one or more kinds selected from the group consisting of Ti and Zr, so that the total is 100% by weight.

5 Claims, No Drawings

CERAMIC POWDER FOR A GREEN SHEET AND MULTILAYER CERAMIC SUBSTRATE

BACKGROUND OF THE INVENTION

1. Field of the Invention

The present invention relates to a ceramic powder for a green sheet and a multilayer ceramic substrate. Specifically, the present invention relates to a ceramic powder for a green sheet that gives a low-temperature fired ceramic substrate with excellent properties in higher frequency bands such as microwave and millimeter-wave bands in the fields of information communications, automobiles, etc., and to a multilayer ceramic substrate.

2. Description of the Related Art

Low-temperature fired multilayer ceramic substrates are in practical use as a technique for supporting high-level information communications. Low-temperature fired multilayer ceramic substrates are obtained by forming a circuit pattern with a conductor paste on a green sheet prepared from a ceramic powder for a green sheet, laminating and integrating a plurality of the green sheets into one, and firing the laminate, which is a multilayer substrate that contains circuit wiring incorporated therein. Low-temperature fired multilayer ceramic substrates are also called co-firable substrates since the green sheet (ceramic material) and the conductor paste (conductor material) are fired simultaneously.

The ceramic powder for a green sheet to be used in preparation of the low-temperature fired multilayer ceramic substrate is generally a mixture of a glass component and a crystalline inorganic compound such as alumina. Here, as low-temperature firing at about 1,000° C. or lower brings about rapid densification as glass components soften in the sintering process, it is possible to select glass components with softening points of 1,000° C. or lower.

In recent years, in the information communications field, the radio wave frequency bands used have become higher with the augmentation of communications equipment and the increase in the number of channels, and microwave and millimeter-wave bands are now being used. The higher the frequency of the radio waves used, the more the radio waves transform into heat in the circuit, that is, the higher the transmission loss. Therefore, users who desire higher performance of a product require a decrease in transmission loss in the higher frequency bands. Factors that greatly influence transmission loss in the higher frequency bands include the dielectric properties of the ceramic substrate and the electric conductivity of the conductor. Of those, the dielectric properties of the ceramic substrate are particularly important, and the contribution ratio is higher, the higher the frequency. Therefore, in order to reduce transmission loss in the higher frequency bands, a ceramic powder is required for a green sheet that gives a ceramic substrate with excellent dielectric properties (that is, with low dielectric constant $\epsilon r$ and dielectric loss tangent $\tan\delta$).

However, it is generally difficult to balance the dielectric properties of a ceramic substrate with low-temperature firing. In particular, in the case of using Ag, with excellent electric conductivity, as a conductor material, as low-temperature firing at 900° C. or lower is required, it is even more difficult to balance the dielectric properties with the low-temperature firing.

Examples of a conventional ceramic powder for a green sheet include a ceramic powder for a green sheet consisting of 12 to 59.6% by weight of alumina, 18 to 69.6% by weight of borosilicate glass, 1 to 40% by weight of anorthite crystal, and 1 to 5% by weight of celsian crystal (see JP 6-305770 A, for example). Such ceramic powder for a green sheet can be fired at a low temperature regardless of firing conditions and can give a ceramic substrate with a low dielectric constant $\epsilon r$ and excellent mechanical strength.

In addition, several reports have disclosed the compositions of aluminosilicate glasses with low dielectric constant $\epsilon r$ and dielectric loss tangent $\tan\delta$ (see JP 11-292567 A and "Glass fiber and glass cloth" by Keita Miyazato et al., Journal of Japan Institute of Electronics Packaging, Vol. 4, No. 2, P. 98-101, for example).

However, JP 6-305770 A does not mention the problems of transmission loss in the higher frequency bands (such as microwave and millimeter-wave bands) and a method for achieving a good balance between dielectric properties and low-temperature firing. In fact, a ceramic substrate produced from the ceramic powder for a green sheet of JP 6-305770 A has poor performance as a substrate for the higher frequency bands because of a larger transmission loss in the higher frequency bands compared with the conventional material, i.e., an alumina substrate. In general, the transmission loss of alumina in the higher frequency bands is small compared with that of a borosilicate or aluminosilicate glass, and the transmission loss in the higher frequency bands can be qualitatively reduced to a certain degree by increasing the amount of alumina incorporated into the ceramic powder for a green sheet of JP 6-305770 A. However, as such a ceramic powder for a green sheet may cause problems in terms of water absorption properties and lack of strength, a glass component with a small transmission loss in the higher frequency bands is desired.

On the other hand, JP 11-292567 A and "Glass fiber and glass cloth" by Keita Miyazato et al., Journal of Japan Institute of Electronics Packaging, Vol. 4, No. 2, P. 98-101 disclose the compositions of aluminosilicate glasses with low dielectric constant $\epsilon r$ and dielectric loss tangent $\tan\delta$. However, glass compositions with the compositions are intended to be used for glass fibers and have high softening temperatures and high viscosities even after softening, and the compositions are inappropriate as components of the ceramic powder for a green sheet.

At the beginning, the inventors of the present invention prepared a ceramic powder for a green sheet containing the glass composition of JP 11-292567 A and alumina powder at various mix ratios and evaluated low-temperature fired ceramic substrates produced from the ceramic powder for a green sheet on their porosities and dielectric properties in microwave bands. Meanwhile, a low-temperature fired ceramic substrate was prepared from the ceramic powder for a green sheet of JP 6-305770 A as a control sample and evaluated in the same way as above. As a result, the low-temperature fired ceramic substrate produced from the ceramic powder for a green sheet including the glass powder of JP 11-292567 A was found to have good dielectric properties and in most cases, small transmission loss compared with the low-temperature fired ceramic substrate of JP 6-305770 A.

However, in the case where the ratio of glass components incorporated is in the range of 40 to 70 vol %, the porosity of a general low-temperature fired ceramic substrate such as the substrate of JP 6-305770 A is about 2%, while the porosity of a low-temperature fired ceramic substrate prepared from the glass powder of JP 11-292567 A is as high as about 20%. That is, a low-temperature fired ceramic substrate prepared from a ceramic powder for a green sheet containing the glass powder of JP 11-292567 A is considered to have high hygroscopicity and does not have the environmental resistance required of a product. The increase in the porosity of a low-temperature fired ceramic substrate is assumed to be caused by high viscosity after softening in the case of the glass composition of JP 11-292567 A. That is, in order to prepare a dense ceramic, a process for allowing a softened glass component to flow into the spaces in the alumina powder is required, but in the case where the viscosity of the glass component is high, it is probably impossible to complete the process within a practical time frame.

Meanwhile, several ceramic powders for a green sheet, which were studied while varying the glass composition, had problems of warping and creasing due to changes in shrinkage behaviors caused by lowering of the softening point of a glass component in the vicinity of the conductor because of the dispersion of silver in the steps of laminating and integrating a plurality of green sheets with circuit patterns formed therein with a silver-based paste and performing co-firing. The warping and creasing can be suppressed by incorporating an alkali metal oxide (such as $Na_2O$ or $K_2O$) into the glass components. However, as described in "Glass fiber and glass cloth" by Keita Miyazato et al., Journal of Japan Institute of Electronics Packaging, Vol. 4, No. 2, P. 98-101, incorporation of an alkali metal oxide increases transmission loss in the higher frequency bands (that is, it decreases dielectric properties).

SUMMARY OF THE INVENTION

The present invention has been made to solve the above-mentioned problems, and an object of the present invention is to provide a ceramic powder for a green sheet that gives a low-temperature fired ceramic substrate that can be fired at a low temperature of 900° C. or less and has excellent dielectric properties in higher frequency bands (such as microwave and millimeter-wave bands), has low hygroscopicity, and even in the case of co-firing with a silver-based conductor paste, has minor warping and creasing, and a multilayer ceramic substrate.

The inventors of the present invention conducted several tests based on the findings that the viscosity of glass components varies depending on the composition and in general can be reduced by incorporating an alkali metal oxide, an alkali earth metal oxide, or boric acid to try to improve various properties. As a result, the inventors have discovered that an increase in the amounts of an alkali earth metal oxide and boric acid in the glass components can decrease the viscosity, and an increase in the amount of boric acid can give a low-temperature fired ceramic substrate with excellent dielectric properties in the higher frequency bands (such as microwave and millimeter-wave bands).

Moreover, the inventors of the present invention have found out that, when the alkali metal oxide is limited to $Li_2O$, the warping and creasing of a low-temperature fired ceramic substrate are suppressed without lowering the dielectric properties in higher frequency bands (such as microwave and millimeter-wave bands) improved by incorporating boric acid.

That is, the present invention provides a ceramic powder for a green sheet including a glass powder and an alumina powder, in which the glass powder contains 35 to 39% by weight of $SiO_2$, 9 to 17% by weight of $Al_2O_3$, 21 to 40% by weight of $B_2O_3$, 10 to 20% by weight of R'O (wherein R' is one or more kinds selected from the group consisting of Mg, Ca and Ba), 0.2 to 2% by weight of $Li_2O$, and 0.5 to 2% by weight of $MO_2$ (wherein M is one or more kinds selected from the group consisting of Ti and Zr), so that the total is 100% by weight.

Further, the present invention provides a multilayer ceramic substrate, comprising an insulator layer obtained by firing a green sheet containing the above-mentioned ceramic powder for a green sheet at 800 to 900° C. and a wiring layer provided with wiring obtained by firing a conductor paste containing silver at 800 to 900° C., the insulator layer and the wiring layer being laminated.

In addition, the present invention provides a method of manufacturing a multilayer ceramic substrate comprising producing a green sheet by forming a slurry containing the ceramic powder for a green sheet into sheets and drying the sheets; printing a wiring on the green sheets using a conductor paste containing silver; laminating the green sheets printed with the conductor paste to integrate the green sheets into one by pressing; and firing the laminate at 800 to 900° C.

According to the present invention, it is possible to provide a ceramic powder for a green sheet that gives a low-temperature fired ceramic substrate that can be fired at a temperature of 900° C. or lower and has excellent dielectric properties in the higher frequency bands (such as microwave and millimeter-wave bands), has low hygroscopicity, and even in the case of co-firing with a silver-based conductor paste, has minor warping and creasing; and a multilayer ceramic substrate.

DETAILED DESCRIPTION OF THE PREFERRED EMBODIMENTS

Embodiment 1

A ceramic powder for a green sheet according to Embodiment 1 of the present invention contains glass powder containing predetermined components and alumina powder.

The glass powder of the present embodiment is one containing $SiO_2$, $Al_2O_3$, $B_2O_3$, R'O (wherein R' is one or more kinds selected from the group consisting of Mg, Ca and Ba), $Li_2O$ and $MO_2$ (wherein M is one or more kind selected from the group consisting of Ti and Zr) as components.

Among the glass components, $SiO_2$ is a glass substance capable of vitrifying by itself. However, the softening point of pure $SiO_2$ is far higher than 1,000° C., and therefore, a glass containing a large amount of $SiO_2$ has a high softening point.

In the present invention, the $SiO_2$ content is 35 to 39% by weight, preferably 37 to 39% by weight. If the $SiO_2$ content is less than 35% by weight, a glass cannot be stably produced, or a chemically stable glass cannot be produced from a material melt. On the other hand, if the $SiO_2$ content is more than 39% by weight, the softening point is raised, resulting in difficulty in low-temperature firing.

$B_2O_3$ is also a glass substance capable of vitrifying by itself. If $B_2O_3$ is incorporated into a glass containing $SiO_2$, the softening point can be lowered. $B_2O_3$ forms a boron-oxygen bond in a glass skeleton. The bond has a higher covalent bonding strength and a smaller electric dipole moment compared with a silicon-oxygen bond, and is therefore inert to electromagnetic waves, thereby reducing transmission loss.

However, an increase in the $B_2O_3$ content in a glass causes orientation of oxygen atoms similar to boric acid, resulting in chemical destabilization of the glass. In this case, silver is significantly dispersed when a green sheet containing such a glass is fired together with a silver-based conductor paste.

In the present invention, the $B_2O_3$ content is 21 to 40% by weight, preferably 22 to 28% by weight. If the $B_2O_3$ content is less than 21% by weight, the desired dielectric properties cannot be achieved. On the other hand, if the $B_2O_3$ content is more than 30% by weight, the glass becomes chemically unstable with the increase in content, resulting in decreased water resistance, acid resistance and alkaline resistance.

Therefore, the gold plating step or the like, which is generally performed in production of a higher frequency part, must be modified. Specifically, the step must be modified by neutralizing a plating bath or by imparting a moisture-proof property by coating with, for example, a fluororesin. However, if the $B_2O_3$ content is more than 40% by weight, the chemical stability of the glass is significantly reduced. Therefore, even if such modifications are performed, a higher frequency part with the desired properties cannot be produced.

An alkali earth metal oxide, R'O (wherein R' is one or more kinds selected from the group consisting of Mg, Ca and Ba) and an alkali metal oxide, $Li_2O$ cannot vitrify by themselves, but are glass modifiers capable of imparting various properties. Such R'O and $Li_2O$ can decrease the viscosity because an alkali metal and an alkali earth metal, which are chemically basic, are present in ion-like forms in a molecular-scale mesh present in the glass and modify the glass to cleave glass skeletons. Meanwhile, the alkali metal oxide, $Li_2O$ can suppress the dispersion of silver.

However, in this mesh, the potential curve of the bond energy of each of the alkali and alkali earth metals is smooth compared with the glass skeleton. Therefore, if the amounts of the alkali earth metal oxide and alkali metal oxide are large, the dielectric relaxation and transmission loss are large. However, lithium is the most lightweight element among alkali metals and has a short bond distance, resulting in a high natural frequency of the electric dipole moment and a small moment value. Accordingly, if the alkali metal is limited to $Li_2O$, an increase in the transmission loss can be suppressed.

In the present invention, the R'O (wherein R' is one or more kinds selected from the group consisting of Mg, Ca and Ba) content is 10 to 20% by weight, preferably 16 to 18% by weight. If the R'O content is less than 10% by weight, the viscosity of the glass is high. On the other hand, if the R'O content is more than 20% by weight, a glass cannot be stably produced from a material melt, nor can the desired dielectric properties be achieved.

The $Li_2O$ content is 0.2 to 2% by weight, preferably 0.5 to 1% by weight. If the $Li_2O$ content is less than 0.2% by weight, the viscosity of the glass is high, and dispersion of silver cannot be suppressed. On the other hand, if the $Li_2O$ content is more than 2% by weight, the desired dielectric properties cannot be achieved.

$Al_2O_3$ also cannot vitrify by itself, but is a glass modifier capable of imparting various properties. $Al_2O_3$ can improve chemical stability.

The $Al_2O_3$ content is 9 to 17% by weight, preferably 12 to 16% by weight. If the $Al_2O_3$ content is less than 12% by weight, the glass becomes chemically unstable with the increase in content, resulting in decreased water resistance, acid resistance and alkaline resistance. Therefore, the gold plating step or the like, which is generally performed in production of a higher frequency part, must be modified. Specifically, the step must be modified by neutralizing a plating bath or by imparting a moisture-proof property by coating with, for example, a fluororesin. However, if the $Al_2O_3$ content is less than 9% by weight, the chemical stability of the glass is significantly reduced. Therefore, even if such modifications are performed, a higher frequency part with the desired properties cannot be produced. On the other hand, if the $Al_2O_3$ content is more than 17% by weight, a glass cannot be stably produced from a material melt.

$MO_2$ (wherein M is one or more kinds selected from the group consisting of Ti and Zr) also cannot vitrify by itself, but is a glass modifier capable of imparting various properties. $MO_2$ can impart the desired viscosity and fluidity to a glass.

The $MO_2$ (wherein M is one or more kinds selected from the group consisting of Ti and Zr) content in a glass is 0.5 to 2% by weight, preferably 0.5 to 1% by weight. If the $MO_2$ content is less than 0.5% by weight, the desired viscosity and fluidity are difficult to achieve. On the other hand, if the $MO_2$ content is more than 2% by weight, the desired dielectric properties cannot be achieved.

In order to impart better viscosity and fluidity to a glass, ZnO and CuO may be incorporated into the glass as components. In this case, the ZnO content in the glass is preferably more than 0% by weight and equal to or less than 10% by weight, more preferably 4 to 6% by weight. If the ZnO content is more than 10% by weight, the desired dielectric properties cannot be achieved because of the reduced ratio of other glass components. Meanwhile, the CuO content in the glass is preferably more than 0% by weight and equal to or less than 0.5% by weight. If the CuO content is more than 0.5% by weight, the desired dielectric properties cannot be achieved.

The glass composition of the glass according to the present embodiment may be finally adjusted to within the above-mentioned ranges. For example, several glasses having glass compositions beyond the ranges may be combined to adjust the final composition to fall within the ranges.

The glass powder according to the present embodiment may be prepared by mixing and melting the above-mentioned components and pulverizing the product in accordance with a conventionally known method. The melting temperature may be set to a temperature suitable for the glass composition.

The alumina powder according to the present embodiment is not particularly limited and may be a commercially available product. The mean particle sizes of the glass powder and alumina powder according to the present embodiment are not particularly limited and are preferably more than 1 μm and less than 3 μm, more preferably 1.5 μm to 2.5 μm. If the mean particle sizes are adjusted to within the ranges, the ceramic shrinkage after firing is reduced, thereby decreasing the warping in the ceramic after firing, and an appropriate degree of density is imparted to the ceramic after firing, thereby achieving excellent electrical properties.

The weight ratio of the glass powder and alumina powder in a ceramic powder for a green sheet according to the present embodiment is preferably in the range of from 2:3 (the ratio of the glass powder is smaller) to 3:2 (the ratio of the glass powder is larger), more preferably 1:1. If the weight ratio of the alumina powder is too large, the ceramic after firing may have a decreased degree of density (less than 98%) and have residual open pores, resulting in decreased electrical properties depending on the humidity (especially, an increase in transmission loss). On the other hand, if the weight ratio of the glass powder is too large, shrinkage of the ceramic after firing is increased, resulting in a significant increase of warping in the fired ceramic so that the ceramic cannot actually be used.

The ceramic powder for a green sheet according to the present embodiment can be produced by mixing the above-mentioned powders at the ratio described above in accordance with a conventionally known method. The mixing method is not particularly limited, and the powders may be mixed using a ball mill or the like. In order to prevent contamination of impurities, the ball is preferably a hard alumina or zirconia ball with high purity.

The thus-prepared ceramic powder for a green sheet can be used in production of a multilayer ceramic substrate.

The multilayer ceramic substrate according to the present embodiment can be manufactured by laminating: an insulator layer obtained by firing a green sheet containing the ceramic powder for a green sheet at 800 to 900° C.; and a wiring layer provided with wiring obtained by firing a conductor paste containing silver at 800 to 900° C.

The multilayer ceramic substrate according to the present embodiment can be manufactured by a manufacturing method including: producing green sheets by forming a slurry containing the ceramic powder for a green sheet into sheets and drying the sheets; printing wiring on the green sheets using a conductor paste containing silver; laminating the green sheets printed with the conductor paste to integrate the green sheets into one by pressing; and firing the laminate at 800 to 900° C.

In the present invention, a slurry containing a ceramic powder for a green sheet can be prepared by adding an organic binder, a plasticizer, a dispersant and an organic solvent to the ceramic powder for a green sheet of the present invention.

Examples of the organic binder include, but are not limited to, polyvinyl butyral and an acrylic resin. Examples of the plasticizer include, but are not limited to, dioctyl phthalate, di-n-butyl phthalate and polyethylene glycol. An example of the dispersant is, but not limited to, triolein. Examples of the organic solvent include, but are not limited to, toluene and an alcohol such as ethanol. The amounts of the organic binder, plasticizer, dispersant and organic solvent are not particularly limited as long as the resultant product is in the form of a slurry, and they may be appropriately adjusted depending on the species of the ceramic powder for a green sheet or the like.

The method of forming a slurry containing a ceramic powder for a green sheet into sheets is not particularly limited, and it may be selected from the doctor blade method, extrusion method, roll coater method and printing method depending on the thickness of the green sheets to be produced.

From the viewpoint of electrical conductivity, the conductor paste containing silver is preferably a silver-based paste containing a conductive component including Ag as a major ingredient, such as Ag—Pd or Ag—Pt, more preferably the Ag paste with the best electrical conductivity.

In addition, before the step of printing wiring on the green sheets, via holes may be formed on the green sheets.

In the step of laminating the green sheets printed with the conductor paste, integrating them by pressing, and firing the product at 800 to 900° C., the pressing method is not particularly limited and it may be performed by isostatic pressing in warm water.

Moreover, before the firing at 800 to 900° C., a heat-degreasing process for degreasing is preferably performed. In the heat-degreasing process for degreasing, the heat-degreasing temperature is preferably in the range of 300 to 500° C. If the temperature is within the range, it is possible to perform sufficient degreasing and to prevent occurrence of bulging, separation, etc. in firing (firing at 800 to 900° C.) for an increase in the degree of density. Meanwhile, the time for the heat-degreasing process may be appropriately set depending on the sizes of the green sheets or the like, and is preferably 5 to 10 hours.

In order to achieve a sufficient increase in the degree of density at a low temperature, the time for the firing at 800 to 900° C. is preferably 1 to 2 hours.

The rate of temperature increase from the time of the heat-degreasing process for degreasing until the firing for increasing the degree of density (firing at 800 to 900° C.) is not particularly limited, and may be appropriately set depending on the sizes of the green sheets or the like.

The thus-manufactured multilayer ceramic substrate can be fired at a low temperature of 900° C. or lower and has excellent dielectric properties in the higher frequency bands (such as microwave and millimeter-wave bands), has low hygroscopicity, and even in the case of co-firing with a silver-based conductor paste, has minor warping or creasing.

EXAMPLES

Hereinafter, the present invention will be described in detail by way of examples, but it is not limited to the following examples.

Examples 1 to 12 and Comparative Examples 1 to 11

According to each of the glass compositions shown in Table 1, the glass components were mixed and melted at 1,400 to 1,600° C., followed by pulverization using a stamp mill or a ball mill, to thereby prepare a glass powder with a mean particle size of 2 μm.

TABLE 1

| | Glass composition (% by weight) | | | | | | | | | |
|---|---|---|---|---|---|---|---|---|---|---|
| | $SiO_2$ | $B_2O_3$ | $Al_2O_3$ | BaO | CaO | MgO | $R_2O$ | $MO_2$ | ZnO | CuO |
| Example 1 | 38.5 | 22.0 | 17.0 | 10.0 | 4.0 | 2.0 | 0.5($Li_2O$) | 0.5($ZrO_2$) | 5.5 | 0.0 |
| Example 2 | 35.0 | 30.0 | 12.0 | 2.5 | 10.0 | 4.0 | 0.2($Li_2O$) | 0.5($ZrO_2$) | 5.5 | 0.3 |
| Example 3 | 39.0 | 21.0 | 17.0 | 10.0 | 6.0 | 1.0 | 0.5($Li_2O$) | 0.5($ZrO_2$) | 5.0 | 0.0 |
| Example 4 | 39.0 | 21.0 | 15.0 | 7.0 | 2.5 | 1.0 | 2.0($Li_2O$) | 2.0($ZrO_2$) | 10.0 | 0.5 |
| Example 5 | 39.0 | 22.0 | 17.0 | 14.0 | 4.0 | 2.0 | 0.5($Li_2O$) | 1.0($ZrO_2$) | 0.0 | 0.5 |
| Example 6 | 36.0 | 26.0 | 15.0 | 4.0 | 10.0 | 2.0 | 1.0($Li_2O$) | 0.5($TiO_2$) | 5.0 | 0.5 |
| Example 7 | 37.0 | 21.0 | 16.0 | 12.0 | 4.0 | 2.0 | 1.5($Li_2O$) | 0.5($TiO_2$) | 5.5 | 0.5 |
| Example 8 | 39.0 | 21.0 | 17.0 | 2.0 | 15.0 | 0.0 | 0.5($Li_2O$) | 0.5($ZrO_2$) | 5.0 | 0.0 |
| Example 9 | 39.0 | 21.0 | 17.0 | 0.0 | 17.0 | 0.0 | 0.5($Li_2O$) | 0.5($ZrO_2$) | 5.0 | 0.0 |
| Example 10 | 39.0 | 21.0 | 15.5 | 7.0 | 12.0 | 1.0 | 2.0($Li_2O$) | 1($TiO_2$) and 1($ZrO_2$) | 0.0 | 0.5 |
| Example 11 | 39.0 | 22.0 | 17.0 | 14.0 | 4.0 | 2.0 | 0.5($Li_2O$) | 1.5($ZrO_2$) | 0.0 | 0.0 |
| Example 12 | 35.0 | 40.0 | 9.0 | 3.0 | 6.0 | 6.0 | 0.5($Li_2O$) | 0.5($ZrO_2$) | 0.0 | 0.0 |
| Comparative Example 1 | 59.5 | 13.0 | 10.0 | 2.0 | 11.0 | 0.0 | 3.5($Na_2O$) | 1.0($TiO_2$) | 0.0 | 0.0 |
| Comparative Example 2 | 38.5 | 22.0 | 17.0 | 10.0 | 4.0 | 2.0 | 0.5($Na_2O$) | 0.5($ZrO_2$) | 5.5 | 0.0 |
| Comparative Example 3 | 38.5 | 22.0 | 17.0 | 10.0 | 4.0 | 2.0 | 0.5($K_2O$) | 0.5($ZrO_2$) | 5.5 | 0.0 |
| Comparative Example 4 | 38.0 | 28.0 | 10.0 | 11.5 | 3.0 | 2.0 | 0.0 | 1.5($ZrO_2$) | 6.0 | 0.0 |

TABLE 1-continued

| | Glass composition (% by weight) | | | | | | | | | |
|---|---|---|---|---|---|---|---|---|---|---|
| | SiO$_2$ | B$_2$O$_3$ | Al$_2$O$_3$ | BaO | CaO | MgO | R$_2$O | MO$_2$ | ZnO | CuO |
| Comparative Example 5 | 37.5 | 21.0 | 19.0 | 10.0 | 4.0 | 2.0 | 0.0 | 0.5(ZrO$_2$) | 5.5 | 0.5 |
| Comparative Example 6 | 56.0 | 20.0 | 15.0 | 0.0 | 6.0 | 1.0 | 0.0 | 2.0(ZrO$_2$) | 0.0 | 0.0 |
| Comparative Example 7 | 34.0 | 30.0 | 15.0 | 8.5 | 3.5 | 2.0 | 1.0(Li$_2$O) | 0.5(ZrO$_2$) | 5.5 | 0.0 |
| Comparative Example 8 | 45.0 | 15.0 | 17.0 | 12.0 | 3.0 | 1.0 | 1.0(Li$_2$O) | 0.5(ZrO$_2$) | 5.5 | 0.0 |
| Comparative Example 9 | 35.0 | 20.0 | 19.0 | 5.0 | 5.0 | 15.0 | 0.5(Li$_2$O) | 0.5(ZrO$_2$) | 0.0 | 0.0 |
| Comparative Example 10 | 35.0 | 20.0 | 15.0 | 12.0 | 1.0 | 1.0 | 0.5(Li$_2$O) | 0.5(ZrO$_2$) | 15.0 | 0.0 |
| Comparative Example 11 | 59.5 | 13.0 | 10.0 | 2.0 | 11.0 | 0.0 | 3.5(Li$_2$O) | 1.0(ZrO$_2$) | 0.0 | 0.0 |

Subsequently, 50 g of the glass powder and 50 g of alumina powder with a mean particle size of 2 μm (purity: 99% or more) were mixed using a ball mill to prepare a ceramic powder for a green sheet, and appropriate amounts of PVD, n-butyl phthalate, triolein and ethanol were further added to the powder to prepare a slurry.

Thereafter, the slurry was used to prepare green sheets with a thickness of about 100 μm by the doctor blade method.

Thirty green sheets were laminated and integrated by isostatic pressing in warm water, followed by firing at 850° C. for 1 hour, to thereby prepare a low-temperature fired ceramic substrate sample. The sample was cut using water as a coolant into a product with a diameter of about 1.3 mm and a length of about 40 mm. The resultant low-temperature fired ceramic substrate sample was evaluated on the dielectric property in the microwave band by the perturbation method using a TM$_{010}$ resonator with a resonant frequency of about 10 GHz. Moreover, the porosity in the sample was calculated from the difference between the specific gravity of the ceramic powder for a green sheet and the specific gravity of the low-temperature fired ceramic substrate sample.

Meanwhile, a predetermined circuit was printed on the above-mentioned green sheets with an Ag conductor paste. Six of the green sheets were laminated and integrated by isostatic pressing in warm water, followed by firing at 850° C. for 1 hour, to thereby prepare a multilayer ceramic substrate sample. Subsequently, the sample was processed into a product with a size of 1 square inch (2.54 square cm). The resultant multilayer ceramic substrate sample was evaluated as to whether it was a practical multilayer substrate with no warping. The practicability of the sample was evaluated based on the following criteria. That is, a sample with a warping of 50 μm or less per inch was evaluated as practical, while a sample with a warping of more than 50 μm per inch was evaluated as impractical. The results are shown in Table 2.

TABLE 2

| | Dielectric constant ($\epsilon_r$) | Dielectric loss tangent (tan δ) | $\epsilon_r \times \tan \delta$ | Porosity (%) | Practicability as fired substrate |
|---|---|---|---|---|---|
| Example 1 | 7.4 | 0.0027 | 0.0200 | 2 | Practical |
| Example 2 | 6.8 | 0.0019 | 0.0129 | 2 | Practical |
| Example 3 | 6.7 | 0.0022 | 0.0147 | 2 | Practical |
| Example 4 | 6.9 | 0.0038 | 0.0262 | 1 | Practical |
| Example 5 | 7.5 | 0.0040 | 0.0300 | 1 | Practical |
| Example 6 | 6.6 | 0.0042 | 0.0277 | 2 | Practical |
| Example 7 | 7.1 | 0.0045 | 0.0320 | 1 | Practical |
| Example 8 | 7.8 | 0.0035 | 0.0273 | 2 | Practical |
| Example 9 | 7.1 | 0.0033 | 0.0234 | 2 | Practical |
| Example 10 | 7.4 | 0.0041 | 0.0303 | 2 | Practical |
| Example 11 | 7.3 | 0.0039 | 0.0285 | 2 | Practical |
| Example 12 | 6.3 | 0.0017 | 0.0107 | 2 | Practical |
| Comparative Example 1 | 7.0 | 0.0065 | 0.0455 | 1 | Practical |
| Comparative Example 2 | 6.9 | 0.0052 | 0.0359 | 1 | Practical |
| Comparative Example 3 | 7.1 | 0.0054 | 0.0383 | 1 | Practical |
| Comparative Example 4 | 6.8 | 0.0021 | 0.0143 | 1 | Impractical |
| Comparative Example 5 | 6.7 | 0.0025 | 0.0168 | 1 | Impractical |
| Comparative Example 6 | 4.9 | 0.0031 | 0.0152 | 21 | Not evaluated |
| Comparative Example 7 | Unmeasurable | Unmeasurable | — | 2 | Not evaluated |
| Comparative Example 8 | 5.7 | 0.0034 | 0.0194 | 5 | Not evaluated |

TABLE 2-continued

|  | Dielectric constant ($\epsilon_r$) | Dielectric loss tangent (tanδ) | $\epsilon_r \times$ tanδ | Porosity (%) | Practicability as fired substrate |
|---|---|---|---|---|---|
| Comparative Example 9 | 7.3 | 0.0052 | 0.0380 | 1 | Impractical |
| Comparative Example 10 | 7.6 | 0.0062 | 0.0471 | 1 | Impractical |
| Comparative Example 11 | 7.1 | 0.0060 | 0.0426 | 1 | Practical |

As shown in Table 2, each of the multilayer ceramic substrate samples of Examples 1 to 12 was found to have excellent dielectric properties because of the small product of the dielectric constant and dielectric loss tangent, and low porosity, and the samples were evaluated as practical as a fired substrate.

On the other hand, each of the multilayer ceramic substrate samples of Comparative Examples 1, 2, 3, and 11 were found to have low porosity and no warping even after firing, but to provide a large product of the dielectric constant and dielectric loss tangent.

Meanwhile, each of the multilayer ceramic substrate samples of Comparative Examples 4 and 5 were found to have low porosity and excellent dielectric properties, but to have warping after firing.

Moreover, each of the multilayer ceramic substrate samples of Comparative Examples 6 and 8 were found to have excellent dielectric properties but high porosity and high hygroscopicity. Therefore, the multilayer ceramic substrate samples of Comparative Examples 6 and 8 were considered to be inappropriate for use in a sealing package or a circuit board.

In the case of the multilayer ceramic substrate sample of Comparative Example 7, it was impossible to measure the dielectric constant and dielectric loss tangent because a sample for measurement could not be produced due to difficulty in processing the sample after firing. Therefore, the multilayer ceramic substrate sample of Comparative Example 7 was considered to be unstable to moisture.

Furthermore, each of the multilayer ceramic substrate samples of Comparative Examples 9 and 10 were found to have low porosity but to provide a large product of the dielectric constant and dielectric loss tangent and have warping after firing.

As is clear from the results, a ceramic powder for a green sheet of the present invention can give a low-temperature fired multilayer ceramic substrate that can be fired at low temperatures of 900° C. or lower and has excellent dielectric properties in the higher frequency bands (such as microwave and millimeter-wave bands), has low hygroscopicity, and even in the case of co-firing with a silver-based conductor paste, has minor warping and creasing. In addition, a multilayer ceramic substrate of the present invention can be fired at a low temperature of 900° C. or lower and has excellent dielectric properties in the higher frequency bands (such as microwave and millimeter-wave bands), has low hygroscopicity, and even in the case of co-firing with a silver-based conductor paste, has minor warping and creasing.

What is claimed is:

1. A ceramic powder for a green sheet comprising a glass powder and an alumina powder, characterized in that the glass powder contains 35 to 39% by weight of $SiO_2$, 9 to 17% by weight of $Al_2O_3$, 21 to 40% by weight of $B_2O_3$, 10 to 20% by weight of R'O, wherein R' is one or more kinds selected from the group consisting of Mg, Ca and Ba, 0.2 to 2% by weight of $Li_2O$, and 0.5 to 2% by weight of $MO_2$, wherein M is one or more kinds selected from the group consisting of Ti and Zr, so that the total is 100% by weight.

2. A ceramic powder for a green sheet according to claim 1, characterized in that a weight ratio of the glass powder and the alumina powder is 4:6 to 6:4.

3. A ceramic powder for a green sheet according to claim 1, characterized in that the glass powder contains at least one of more than 0% by weight and 10% by weight or less of ZnO or more than 0% by weight and 0.5% by weight or less of CuO.

4. A multilayer ceramic substrate, comprising an insulator layer obtained by firing a green sheet containing the ceramic powder for a green sheet according to claim 1 at 800 to 900° C.; and a wiring layer provided with wiring obtained by firing a conductor paste containing silver at 800 to 900° C., the insulator layer and the wiring layer being laminated.

5. A method of manufacturing a multilayer ceramic substrate comprising:
producing green sheets by forming a slurry containing the ceramic powder for a green sheet according to claim 1 into sheets and drying the sheets;
printing wiring on the green sheets using a conductor paste containing silver;
laminating the green sheets printed with the conductor paste to integrate the green sheets into one by pressing; and
firing the laminate at 800 to 900° C.

* * * * *